United States Patent
Fan et al.

(10) Patent No.: US 10,388,518 B2
(45) Date of Patent: Aug. 20, 2019

(54) EPITAXIAL SUBSTRATE AND METHOD OF MANUFACTURING THE SAME

(71) Applicant: GlobalWafers Co., Ltd., Hsinchu (TW)

(72) Inventors: Chun-I Fan, Hsinchu (TW); Chih-Yuan Chuang, Hsinchu (TW); Man-Hsuan Lin, Hsinchu (TW); Wen-Ching Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/921,654

(22) Filed: Mar. 15, 2018

(65) Prior Publication Data

US 2018/0286664 A1 Oct. 4, 2018

Related U.S. Application Data

(60) Provisional application No. 62/479,337, filed on Mar. 31, 2017.

(51) Int. Cl.
*H01L 21/02* (2006.01)
*H01L 29/20* (2006.01)
(Continued)

(52) U.S. Cl.
CPC .... *H01L 21/0254* (2013.01); *H01L 21/02381* (2013.01); *H01L 21/02433* (2013.01);
(Continued)

(58) Field of Classification Search
CPC ........... H01L 21/0254; H01L 21/02433; H01L 21/02381; H01L 21/02458; H01L 23/34;
(Continued)

(56) References Cited

U.S. PATENT DOCUMENTS

| | | | |
|---|---|---|---|
| 2006/0246267 A1* | 11/2006 | Jain | H01L 21/187 428/195.1 |
| 2015/0090956 A1* | 4/2015 | Coones | H01L 21/76251 257/14 |

(Continued)

FOREIGN PATENT DOCUMENTS

| | | |
|---|---|---|
| TW | 201543548 | 11/2015 |
| TW | 201600621 | 1/2016 |

(Continued)

OTHER PUBLICATIONS

Office Action of Taiwan Counterpart Application, dated Jul. 27, 2018, pp. 1-3.

*Primary Examiner* — Julia Slutsker
(74) *Attorney, Agent, or Firm* — JCIPRNET

(57) ABSTRACT

An epitaxial substrate and a method of manufacturing the same are provided. The epitaxial substrate includes a handle substrate, a heat dissipation layer on the handle substrate, a high-resistance silicon substrate on the heat dissipation layer, and a III-V semiconductor layer grown on the high-resistance silicon substrate. The heat dissipation layer has high thermal conductivity. The high-resistance silicon substrate has a resistance more than 100 ohm·cm. Diameters of the high-resistance silicon substrate and the III-V semiconductor film are smaller than a diameter of the handle substrate, such that the epitaxial substrate is a convex substrate.

6 Claims, 6 Drawing Sheets

(51) Int. Cl.
*H01L 23/34* (2006.01)
*H01L 21/683* (2006.01)

(52) U.S. Cl.
CPC ........ *H01L 21/02458* (2013.01); *H01L 23/34* (2013.01); *H01L 29/20* (2013.01); *H01L 21/6835* (2013.01); *H01L 2221/68304* (2013.01)

(58) Field of Classification Search
CPC ........... H01L 29/20; H01L 2221/68304; H01L 21/6835
See application file for complete search history.

(56) References Cited

U.S. PATENT DOCUMENTS

| | | | |
|---|---|---|---|
| 2015/0171171 A1* | 6/2015 | LaRoche | H01L 21/0254 257/615 |
| 2015/0332914 A1* | 11/2015 | Yamada | H01L 21/02458 257/76 |
| 2016/0233123 A1* | 8/2016 | Kato | H01L 21/6835 |
| 2017/0207214 A1* | 7/2017 | Or-Bach | H01L 27/0688 |
| 2017/0309589 A1* | 10/2017 | Kwack | H01L 24/32 |

FOREIGN PATENT DOCUMENTS

| | | |
|---|---|---|
| TW | 201635394 | 10/2016 |
| TW | 201638372 | 11/2016 |
| TW | 201724555 | 7/2017 |

\* cited by examiner

EPITAXIAL SUBSTRATE AND METHOD OF MANUFACTURING THE SAME

CROSS-REFERENCE TO RELATED APPLICATION

This application claims the priority benefit of U.S. provisional application Ser. No. 62/479,337, filed on Mar. 31, 2017. The entirety of each of the above-mentioned patent applications is hereby incorporated by reference herein and made a part of this specification.

BACKGROUND

Technical Field

The present invention relates to a substrate and a method of manufacturing the same; in particular, to an epitaxial substrate and a method of manufacturing the same.

Description of Related Art

Epitaxy refers to a technique of growing new crystals on a substrate to from a semiconductor layer. Since the layer grown by the epitaxial process has the advantages of high purity, good thickness controllability, and so on, it has been widely used in the manufacture of semiconductor devices.

However, in the epitaxial process, the defects (e.g. crack, slip line, etc.) may be generated at the edge of the wafer due to collision or crush. Those defects will affect the subsequently-formed device, resulting in poor device quality. Moreover, because the interface between the device and the substrate is silicon dioxide, SOI (silicon on insulator) substrate has the problem of poor heat dissipation, which affects the device lifetime. In addition, the epitaxial substrate currently used in the field of high power has the problem of low mechanical strength and the like.

Therefore, there is a requirement for an epitaxial substrate that can solve the above problems.

SUMMARY

Accordingly, the present invention is directed to an epitaxial substrate to solve the problems of edge defects, poor heat dissipation, and low mechanical strength.

The present invention is further directed to a method of manufacturing an epitaxial substrate for forming a device with low defects, good heat dissipation, and high mechanical strength.

The epitaxial substrate includes a handle substrate, a heat dissipation layer on the handle substrate, a high-resistance silicon substrate on the heat dissipation layer, and a III-V semiconductor layer grown on the high-resistance silicon substrate. The high-resistance silicon substrate has a resistance more than 100 ohm·cm. Diameters of the III-V semiconductor layer and the high-resistance silicon substrate are smaller than a diameter of the handle substrate, thereby the epitaxial substrate being a convex substrate.

In an embodiment of the invention, the heat dissipation layer is consisted of a first patterned structure and a second patterned structure, a material of the first patterned structure is different from a material of the second patterned structure, and the first patterned structure and the second patterned structure are complementary structures.

In an embodiment of the invention, a thickness of the high-resistance silicon substrate is less than 5 μm.

In an embodiment of the invention, the III-V semiconductor layer includes a III-V semiconductor film and a buffer layer disposed between the III-V semiconductor film and the high-resistance silicon substrate.

In an embodiment of the invention, the epitaxial substrate further includes an N type layer disposed between the III-V semiconductor layer and the high-resistance silicon substrate.

In an embodiment of the invention, the heat dissipation layer includes a first heat dissipation film on the handle substrate, a barrier layer on the first heat dissipation film, and a second heat dissipation film on the barrier layer.

The method of manufacturing an epitaxial substrate includes providing a handle substrate, forming a heat dissipation layer, forming a high-resistance silicon substrate between the handle substrate and the high-resistance silicon substrate, and growing a III-V semiconductor layer on the high-resistance silicon substrate, wherein diameters of the grown III-V semiconductor layer and the formed high-resistance silicon substrate are smaller than a diameter of the handle substrate, thereby the epitaxial substrate being a convex substrate.

In another embodiment of the invention, the step of forming the heat dissipation layer includes forming a first patterned structure on the handle substrate, and forming a second patterned structure on the first patterned structure, wherein a material of the first patterned structure is different from a material of the second patterned structure, and the first patterned structure and the second patterned structure are complementary structures.

In another embodiment of the invention, the step of forming the III-V semiconductor layer includes forming a buffer layer on the high-resistance silicon substrate, and forming a III-V semiconductor film on the buffer layer.

In another embodiment of the invention, after forming the high-resistance silicon substrate, an N type layer is further formed on the high-resistance silicon substrate.

In another embodiment of the invention, the step of forming the heat dissipation layer includes forming a first heat dissipation film, a barrier layer, and a second heat dissipation film between the handle substrate and the high-resistance silicon substrate.

In another embodiment of the invention, after forming the high-resistance silicon substrate, an annealing is further performed to bond the heat dissipation layer and the high-resistance silicon substrate.

In another embodiment of the invention, a temperature of the annealing is between 900° C. and 1200° C., and a time of the annealing is from 4 hours to 30 hours.

Based on the above, in the epitaxial substrate according to the present invention, the heat dissipation layer is used to improve heat dissipation for reducing the thermal impact to the device and increasing the device lifetime, and thus the device can be adopted to higher power field. Moreover, the epitaxial substrate of the present invention is a convex substrate, so it can prevent the edge of the wafer from collision or crush, thereby avoiding the generation of defects. Furthermore, since the epitaxial substrate of the present invention has a combination of the high-resistance silicon substrate and the handle substrate, the capability of voltage resistance of the substrate and the mechanical strength can be improved simultaneously.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
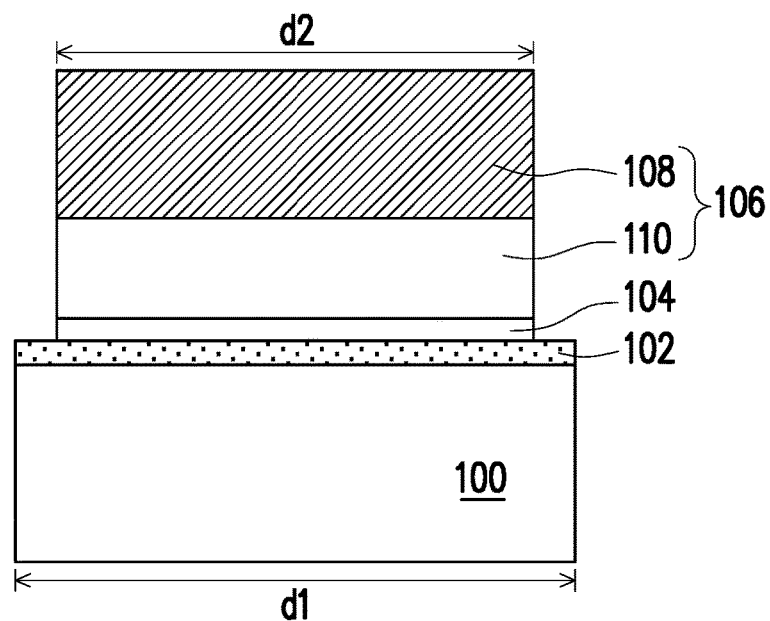
FIG. 1 is a schematic cross-sectional view illustrating an epitaxial substrate according to a first embodiment of the invention.

Referring to the embodiments below and the accompanied drawings for a sufficient understanding of the disclosure. However, the disclosure may still be implemented in many other different forms and should not be construed as limited to the embodiments described hereinafter. In the drawings, for clarity, the components and their relative dimensions may not be illustrated based on their actual sizes. For easy understanding, the same components in the following embodiments will be denoted by the same reference numerals.

FIG. 1 is a schematic cross-sectional view illustrating an epitaxial substrate according to a first embodiment of the invention.

Referring to FIG. 1, the epitaxial substrate of the first embodiment includes a handle substrate 100, a heat dissipation layer 102 on the handle substrate 100, a high-resistance silicon substrate 104 on the heat dissipation layer 102, and a III-V semiconductor layer 106 grown on the high-resistance silicon substrate 104. The sizes (diameter d2) of the high-resistance silicon substrate 104 and the III-V semiconductor layer 106 are smaller than that (diameter d1) of the handle substrate 100.

The heat dissipation layer 102 has high thermal conductivity such as 10 W/mK or more. The heat dissipation layer 102 also has high resistance, and the thermal expansion coefficient thereof is, for example, close to that of silicon. In one embodiment, the heat dissipation layer 102 includes, for example, aluminum nitride (AlN), diamond, boron nitride (BN), or silicon nitride ($Si_xN_y$ in which x and y are natural constants). The high-resistance silicon substrate 104 has a resistance more than 100 ohm·cm. In one embodiment, the high-resistance silicon substrate 104 may include undoped silicon or lightly-doped silicon. The high-resistance silicon substrate 104 has a thickness less than 5 μm, for example. Since the high-resistance silicon substrate 104 is used as an electrical barrier between the handle substrate 100 and the III-V semiconductor layer 106, it is expected to improve the capability of voltage resistance and increase breakdown voltage of device.

The difference between the diameter d1 of the handle substrate 100 and the diameter d2 of the others (e.g. the high-resistance silicon substrate 104) is, for example, between 200 μm and 6000 μm, preferably between 600 μm and 1500 μm. For example, if the diameter d1 of the handle substrate 100 and the heat dissipation layer 102 is 300 mm, and the diameter d2 of the others (i.e. the III-V semiconductor layer 106 and the high-resistance silicon substrate 104) is 299.8 mm, and thus the difference between the diameter d1 of the handle substrate 100 and the diameter d2 of the others is (300−299.8)=200 μm. In other words, each of sides of the III-V semiconductor layer 106 and the high-resistance silicon substrate 104 is trimmed by 100 μm in comparison with the handle substrate 100.

The handle substrate 100 includes, for example, p-type silicon, glass, silicon carbide (SiC), or sapphire handle substrate. In case of the handle substrate 100 being p-type silicon, the resistance of the handle substrate 100 is about $10^{-3}$ to $10^{-2}$ ohm·cm, and the p-type silicon has a (111)-plane or (100)-plane. The handle substrate 100 with low resistance is expected to reduce bowing and crack. The materials of the handle substrate 100 and the high-resistance silicon substrate 104 may be homogeneous or heterogeneous. Moreover, the high-resistance silicon substrate 104 is not limited to silicon, but it may be made of silicon carbide (SiC), sapphire, gallium arsenide (GaAs), or other III-V compounds.

In the first embodiment, the III-V semiconductor layer 106 may include a III-V semiconductor film 108 and a buffer layer 110 between the III-V semiconductor film 108 and the high-resistance silicon substrate 104. The III-V semiconductor film 108 includes, for example, GaN or the like. The material of the buffer layer 110 includes, for example, AlN, AlGaN, or other material for buffering the difference in lattice constant between the III-V semiconductor film 108 and the high-resistance silicon substrate 104. The step of forming the III-V semiconductor layer 106 includes, for example, forming the buffer layer 110 on the high-resistance silicon substrate 104 and then forming the III-V semiconductor film 108 on the buffer layer 110. The methods of forming the buffer layer 110 and the III-V semiconductor film 108 include epitaxial process.

Because the diameters d2 of the high-resistance silicon substrate 104 and the III-V semiconductor layer 106 are smaller than the diameter d1 of the handle substrate 100 (and the heat dissipation layer 102), the epitaxial substrate of the first embodiment is regarded as a convex substrate.

Figure 2:
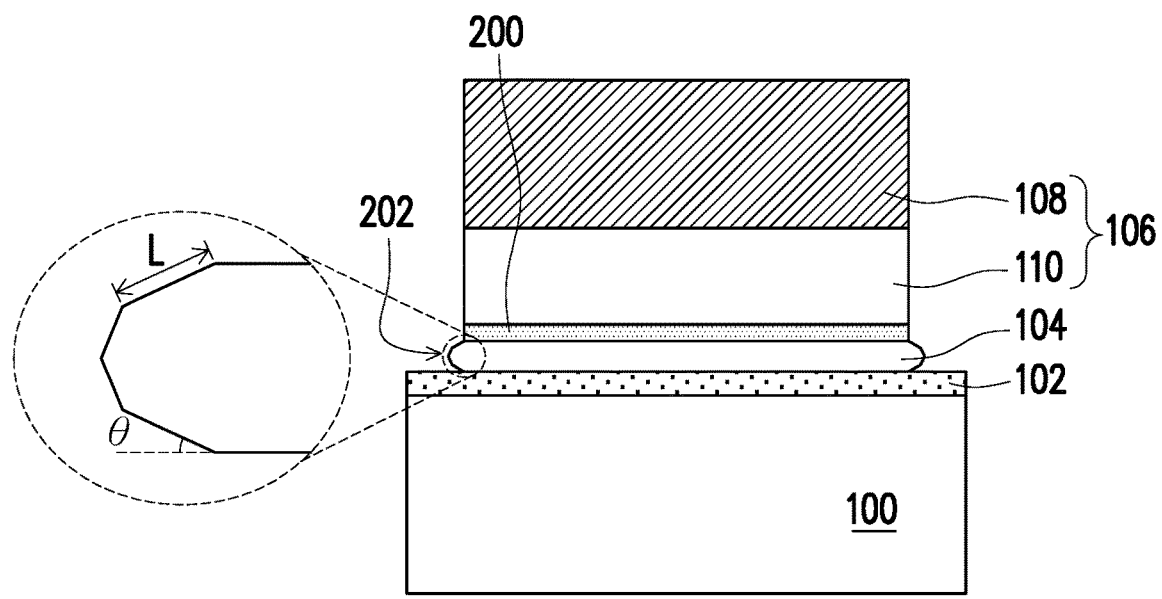
FIG. 2 is a schematic cross-sectional view illustrating an epitaxial substrate according to a second embodiment of the invention.

FIG. 2 is a schematic cross-sectional view illustrating an epitaxial substrate according to a second embodiment of the invention. It should be mentioned that the same reference numbers or symbols as those in the first embodiment are also used herein to represent the same components.

Referring to FIG. 2, an N type layer 200 is formed between the III-V semiconductor layer 106 and the high-resistance silicon substrate 104. In one embodiment, the N type layer 200 has a thickness of several nanometers to several micrometers and a doping concentration of $10^{10}$-$10^{19}$ atom/cm$^3$.

The method for forming the N type layer 200 includes bonding N type wafer, diffusing N type dopants (e.g. phosphorus, arsenic, or antimony) into desired depth of the surface of the high-resistance silicon substrate 104, homogeneous epitaxy N type silicon, or ion implanting the N type dopants (e.g. phosphorus, arsenic, or antimony) into desire depth of the surface of the high-resistance silicon substrate 104. In the second embodiment, the buffer layer 110 includes, for example, AlN or AlGaN.

Moreover, the high-resistance silicon substrate 104 may be a chip with a deflection angle of 0.2° so as to ease the lattice matching. Alternatively, the high-resistance silicon substrate 104 further includes a bevel 202, and the bevel 202 has a bevel length L of 350-1500 µm, preferably 700 µm. The bevel angle θ of the bevel 202 is, for example, between 7° and 8°. In the second embodiment, the high-resistance silicon substrate 104 may be a silicon wafer with a resistance more than 100 ohm·cm, more than 1,000 ohm·cm, more than 6,000 ohm·cm, or more than 10,000 ohm·cm.

Figure 3:
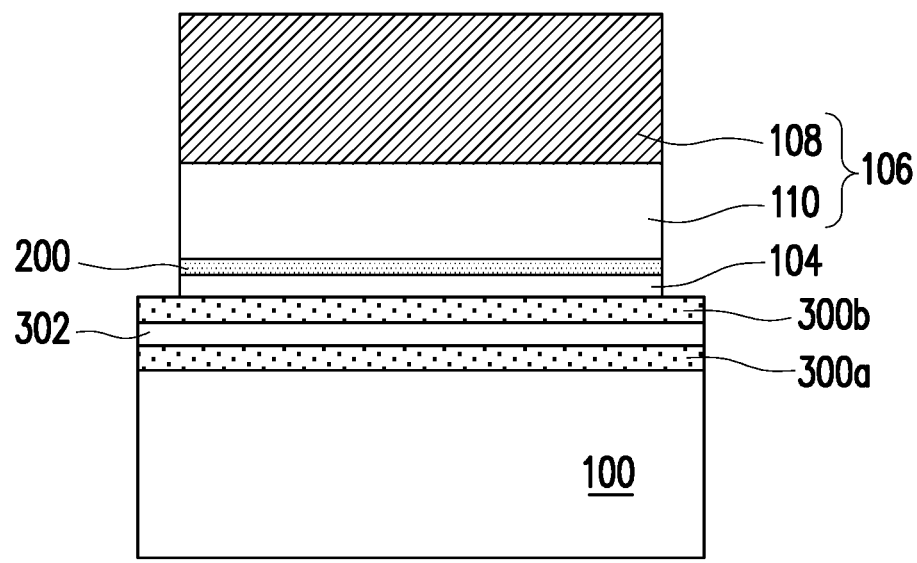
FIG. 3 is a schematic cross-sectional view illustrating an epitaxial substrate according to a third embodiment of the invention.

FIG. 3 is a schematic cross-sectional view illustrating an epitaxial substrate according to a third embodiment of the invention. It should be mentioned that the same reference numbers or symbols as those in the second embodiment are also used herein to represent the same components.

Referring to FIG. 3, there is a laminated structure between the handle substrate 100 and the high-resistance silicon substrate 104. In particular, the laminated structure is the heat dissipation layer including a first heat dissipation film 300a, a barrier layer 302, and a second heat dissipation film 300b over the handle substrate 100 orderly. In the third embodiment, a material of the first and second heat dissipation films 300a and 300b are AlN, and a material of the barrier layer 302 is $Si_xN_y$, in which x and y are natural constants.

The laminated structure in FIG. 3 is a three-layer structure, but this invention is not limited thereto. The laminated structure may have more layers including alternatively-stacked heat dissipation film and barrier layer.

Figure 4:
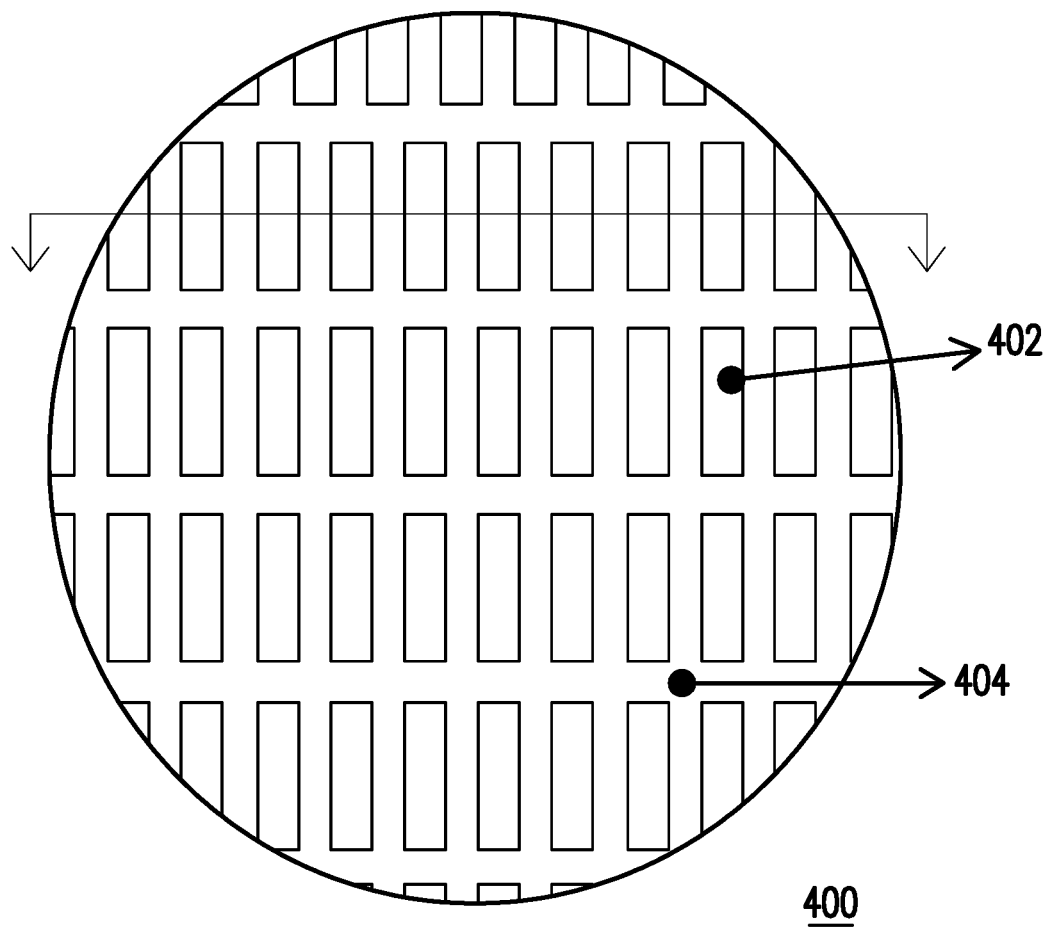
FIG. 4 is a top view illustrating a heat dissipation layer of an epitaxial substrate according to a fourth embodiment of the invention.

FIG. 4 is a top view illustrating a heat dissipation layer of an epitaxial substrate according to a fourth embodiment of the invention.

Referring to FIG. 4, a heat dissipation layer 400 has a first patterned structure 402 and a second patterned structure 404, wherein a material of the first patterned structure 402 is different from a material of the second patterned structure 404, and the first patterned structure 402 and the second patterned structure 404 are complementary structures. In one embodiment, the first patterned structure 402 is $SiO_2$ for improving insulation, and the second patterned structure 404 is AlN for heat dissipation. In another embodiment, the first patterned structure 402 is AlN, and the second patterned structure 404 is $SiO_2$.

Figure 5A:
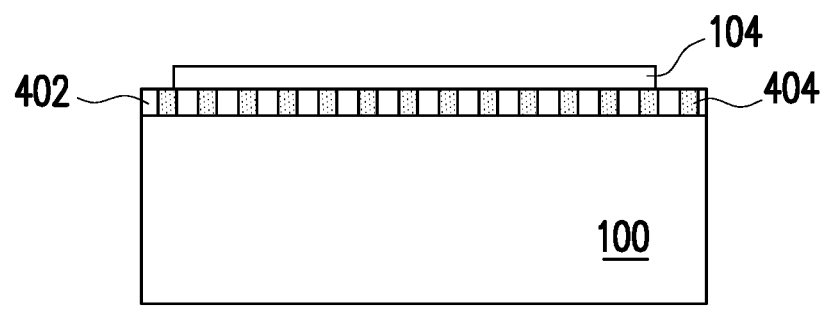
FIG. 5A is a schematic cross-sectional view illustrating one example of FIG. 4.
Figure 5B:
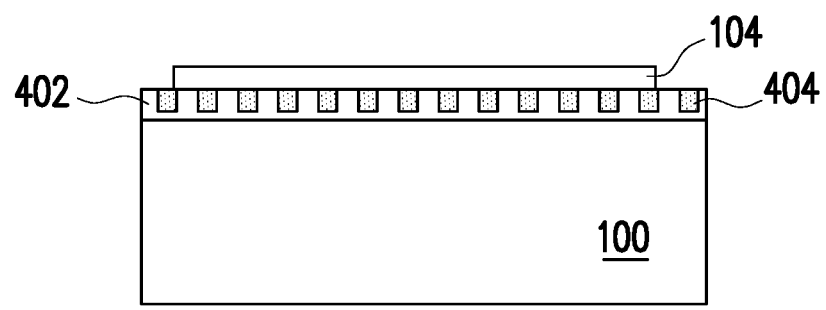
FIG. 5B is a schematic cross-sectional view illustrating another example of FIG. 4.

FIG. 5A and FIG. 5B are cross-sectional view illustrating two examples of FIG. 4, respectively.

In FIG. 5A, the first patterned structure 402 is etched until the handle substrate 100 is exposed. In FIG. 5B, the first patterned structure 402 is not etched to expose the handle substrate 100. Since the first patterned structure 402 in FIG. 5A contacts with the high-resistance silicon substrate 104 and the handle substrate 100, the capability of heat dissipation is better if the first patterned structure 402 is AlN.

Figure 6A:
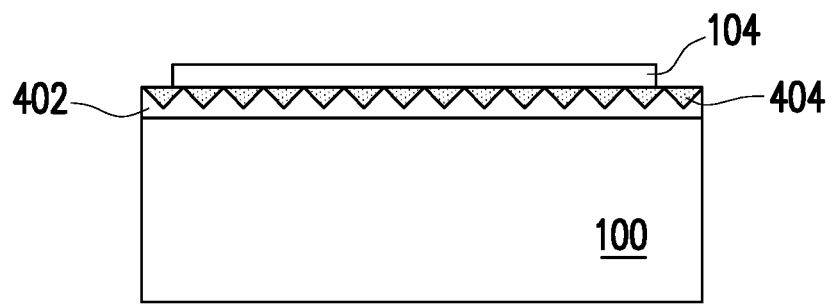
FIG. 6A is a schematic cross-sectional view illustrating yet another example of FIG. 4.
Figure 6B:
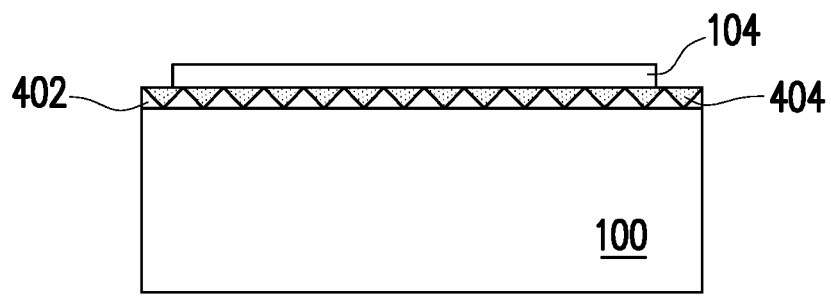
FIG. 6B is a schematic cross-sectional view illustrating yet further example of FIG. 4.

FIG. 6A and FIG. 6B are cross-sectional view illustrating another two examples of the patterned substrate of FIG. 4, respectively.

In FIG. 6A, the first patterned structure 402 is not etched to expose the handle substrate 100, and the upper profile of the first patterned structure 402 consists of many triangle shapes. In FIG. 6B, the first patterned structure 402 is etched until the handle substrate 100 is exposed, and thus it consists of separated triangle cones. However, the invention is not limited thereto, the first patterned structure 402 may be other shapes, and the shape of the second patterned structure 404 can be complementary to that of the first patterned structure 402.

Since the first patterned structure 402 in FIG. 6B contacts with the high-resistance silicon substrate 104 and the handle substrate 100, the capability of heat dissipation is better if the first patterned structure 402 is AlN.

Even through there is no descriptions about other elements (e.g. the high-resistance silicon substrate, the III-V semiconductor layer, etc.) in the fourth embodiment, it is known that the descriptions of the other elements in above embodiments can be utilized herein.

Figure 7:
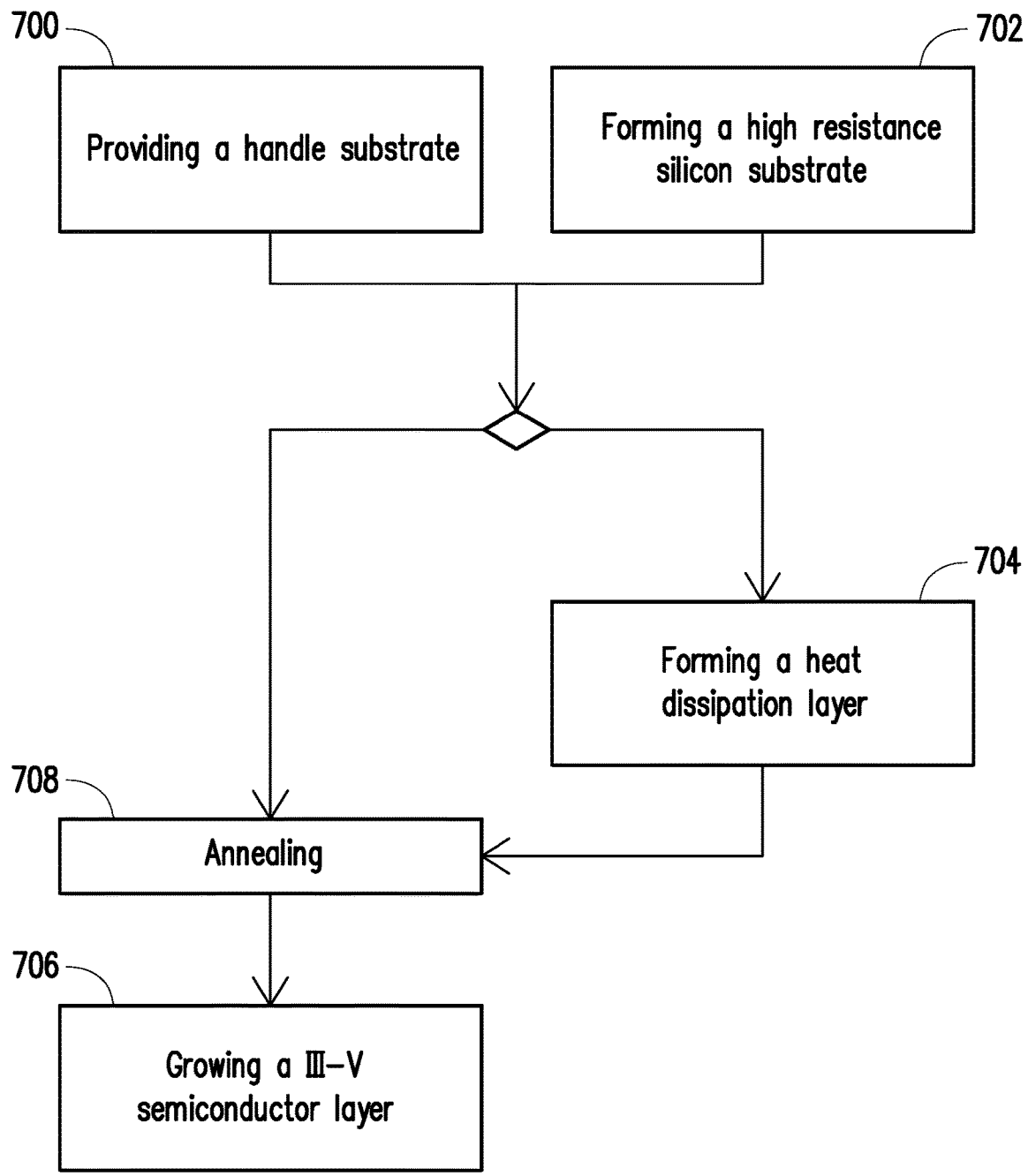
FIG. 7 is a step diagram of manufacturing an epitaxial substrate according to a fifth embodiment of the invention.

FIG. 7 is a step diagram of manufacturing an epitaxial substrate according to a fifth embodiment of the invention.

Referring to FIG. 7, the method of manufacturing an epitaxial substrate of the fifth embodiment includes the steps 700 to 706. In step 700, a handle substrate is provided. In step 702, a high-resistance silicon substrate is formed. In step 704, a heat dissipation layer is formed. In step 706, a III-V semiconductor layer is grown. The steps 700, 702, and 704 are not limited to perform in order. In other words, the step 702 may be performed before the step 700, and the step 704 may be also performed before the step 700 and after the step 702. Alternatively, the step 702 may be performed after the steps 700 and 704.

In the fifth embodiment, the high-resistance silicon substrate is formed between the handle substrate and the high-resistance silicon substrate, and the III-V semiconductor layer is grown on the high-resistance silicon substrate, wherein diameters of the grown III-V semiconductor layer and the formed high-resistance silicon substrate are smaller than a diameter of the handle substrate, thereby the epitaxial substrate being a convex substrate.

In one embodiment, the step 704 may include forming a first patterned structure on the handle substrate and forming a second patterned structure on the first patterned structure, wherein a material of the first patterned structure is different from a material of the second patterned structure, and the first patterned structure and the second patterned structure are complementary structures.

In another embodiment, the step 704 may include forming a first heat dissipation film, a barrier layer, and a second heat dissipation film between the handle substrate and the high-resistance silicon substrate.

The step 706 may include forming a buffer layer on the high-resistance silicon substrate, and then forming a III-V semiconductor film on the buffer layer.

Moreover, after the step 702, an N type layer may be further formed on the high-resistance silicon substrate.

In addition, after the step 702, an annealing may be further performed to bond the heat dissipation layer and the high-resistance silicon substrate (i.e. step 708). For example, a temperature of the annealing is between 900° C. and 1200° C., and a time of the annealing is from 4 hours to 30 hours.

The exemplificative steps for manufacturing the epitaxial substrate are as follows.

Take the example of the epitaxial substrate of FIG. 2, there are many embodiments of the present invention to manufacture the epitaxial substrate.

<Process 1-1>

The first step: The heat dissipation layer 102 is formed on the handle substrate 100. The method of forming the heat dissipation layer 102 includes, but is no limited to, MOCVD, CVD, sputtering, or ALD.

The second step: The N type layer 200 is formed on a first surface of the high-resistance silicon substrate 104. The method of forming the N type layer 200 includes, but is no limited to, MOCVD, CVD, sputtering, or ALD. In another embodiment, the N type layer 200 is formed near the first surface of the high-resistance silicon substrate 104, and the method of forming the N type layer 200 includes, but is no limited to, ion implantation or diffusion.

The first and second steps may be performed at the same time. Alternatively, the first step is before the second step; vice versa.

The third step: The heat dissipation layer 102 formed on the handle substrate 100 is bonded to a second surface of the high-resistance silicon substrate 104, wherein the second surface is opposite the first surface of the high-resistance silicon substrate 104. During the bonding, an annealing is performed.

The fourth step: The III-V semiconductor layer 106 is grown on the N type layer 200 by epitaxial process.

<Process 1-2>

The first step: The N type layer 200 and the heat dissipation layer 102 are formed on a first surface and a second surface of the high-resistance silicon substrate 104, respectively. The first surface is opposite to the second surface. The order of forming the N type layer 200 and the heat dissipation layer 102 is not limited. The method for forming the N type layer 200 and the heat dissipation layer 102 may refer to above Process 1-1, and thus it is not repeated herein.

The second step: The heat dissipation layer 102 is bonded to a surface of the handle substrate 100 by annealing.

The third step: The III-V semiconductor layer 106 are grown on the N type layer 200 by epitaxial process.

<Process 1-3>

The first step: The heat dissipation layer 102 is formed on the handle substrate 100. The method for forming the heat dissipation layer 102 may refer to above Process 1-1, and thus it is not repeated herein.

The second step: A second surface of the high-resistance silicon substrate 104 is bonded to the heat dissipation layer 102 by annealing.

The third step: The N type layer 200 is formed on a first surface of the high-resistance silicon substrate 104. The method for forming the N type layer 200 may refer to above Process 1-1, and thus it is not repeated herein.

The fourth step: The III-V semiconductor layer 106 are grown on the N type layer 200 by epitaxial process.

<Process 1-4>

The first step: The heat dissipation layer 102 is formed on a second surface of the high-resistance silicon substrate 104. The method for forming the heat dissipation layer 102 may refer to above Process 1-1, and thus it is not repeated herein.

The second step: The heat dissipation layer 102 formed on the high-resistance silicon substrate 104 is bonded to the handle substrate 100 by annealing.

The third step: The N type layer 200 is formed on a first surface of the high-resistance silicon substrate 104. The method for forming the N type layer 200 may refer to above Process 1-1, and thus it is not repeated herein.

The fourth step: The III-V semiconductor layer 106 are grown on the N type layer 200 by epitaxial process.

Take the example of the epitaxial substrate of FIG. 3, there are also many ways to manufacture the epitaxial substrate.

<Process 2-1>

The first step: The heat dissipation layer 300a and the barrier layer 302 are formed on the handle substrate 100 in order. The method of forming the heat dissipation layer 300a and the barrier layer 302 includes, but is no limited to, MOCVD, CVD, sputtering, or ALD.

The second step: The N type layer 200 and the heat dissipation layer 300b are formed on a first surface and a second surface of the high-resistance silicon substrate 104, respectively. The first surface is opposite to the second surface. The method of forming the heat dissipation layer 300b includes, but is no limited to, MOCVD, CVD, sputtering, or ALD. The method of forming the N type layer 200 includes, but is no limited to, MOCVD, CVD, sputtering, or ALD.

In another embodiment, the N type layer 200 is formed near the first surface of the high-resistance silicon substrate 104, and the method of forming the N type layer 200 includes, but is no limited to, ion implantation or diffusion.

The first and second steps may be performed at the same time. Alternatively, the first step is before the second step; vice versa.

The third step: The barrier layer 302 formed on the heat dissipation layer 300a is bonded to the heat dissipation layer 300b formed on the second surface of the high-resistance silicon substrate 104 by annealing.

The fourth step: The III-V semiconductor layer 106 are grown on the N type layer 200 by epitaxial process.

<Process 2-2>

The first step: The heat dissipation layer 300a is formed on the handle substrate 100. The method for forming the heat dissipation layer 300a may refer to above Process 2-1, and thus it is not repeated herein.

The second step: The N type layer 200 is formed on a first surface of the high-resistance silicon substrate 104, and the heat dissipation layer 300b and the barrier layer 302 are orderly formed on a second surface of the high-resistance silicon substrate 104. The order of forming the N type layer 200, the heat dissipation layer 300b and the barrier layer 302 is not limited. The method for forming the N type layer 200, the heat dissipation layer 300b and the barrier layer 302 may refer to above Process 2-1, and thus it is not repeated herein.

The first and second steps may be performed at the same time. Alternatively, the first step is before the second step; vice versa.

The third step: The heat dissipation layer 300a formed on the handle substrate 100 is bonded to the barrier layer 302 formed on the heat dissipation layer 300b by annealing.

The fourth step: The III-V semiconductor layer 106 are grown on the N type layer 200 by MOCVD.

<Process 2-3>

The first step: The heat dissipation layer 300a, the barrier layer 302 and the heat dissipation layer 300b are formed on the handle substrate 100 in order. The method for forming the heat dissipation layers 300a and 300b and the barrier layer 302 may refer to above Process 2-1, and thus it is not repeated herein.

The second step: The N type layer 200 is formed on a first surface of the high-resistance silicon substrate 104. The method for forming the N type layer 200 may refer to above Process 1-1, and thus it is not repeated herein.

The third step: A second surface of the high-resistance silicon substrate 104 is bonded to the heat dissipation layer 300b formed on the barrier layer 302 by annealing. The first surface of the high-resistance silicon substrate 104 is opposite to the second surface thereof.

The fourth step: The III-V semiconductor layer 106 are grown on the N type layer 200 by epitaxial process.

<Process 2-4>

The first step: The heat dissipation layer 300a, the barrier layer 302 and the heat dissipation layer 300b are formed on the handle substrate 100 in order. The method for forming the heat dissipation layers 300a and 300b and the barrier layer 302 may refer to above Process 2-1, and thus it is not repeated herein.

The second step: A second surface of the high-resistance silicon substrate 104 is bonded to the heat dissipation layer 300b formed on the barrier layer 302 by annealing.

The third step: The N type layer 200 is formed on a first surface of the high-resistance silicon substrate 104. The first surface of the high-resistance silicon substrate 104 is opposite to the second surface thereof.

The fourth step: The III-V semiconductor layer 106 are grown on the N type layer 200 by epitaxial process.

<Process 2-5>

The first step: An alternative-stacked structure containing the heat dissipation layer and the barrier layer formed in order is formed on the handle substrate 100, and the top layer of the alternative-stacked structure is heat dissipation layer. The method for forming the heat dissipation layers and the barrier layer may refer to above Process 2-1, and thus it is not repeated herein.

The second step: A second surface of the high-resistance silicon substrate 104 is bonded to the top heat dissipation layer by annealing.

The third step: The N type layer 200 is formed on a first surface of the high-resistance silicon substrate 104. The first surface of the high-resistance silicon substrate 104 is opposite to the second surface thereof. The method for forming the N type layer 200 may refer to above Process 2-1, and thus it is not repeated herein.

The second step may be performed before the third step, or the third step may be performed before the second step. For example, if the third step is before the second step, the N type layer 200 would be formed on the first surface of the high-resistance silicon substrate 104, and then the second surface of the high-resistance silicon substrate 104 is bonded to the top heat dissipation layer by annealing.

The fourth step: The III-V semiconductor layer 106 are grown on the N type layer 200 by epitaxial process.

Take the example of the patterned substrate 400 of FIG. 4, its manufacturing method is related to photolithography.

The first step: A first material layer is formed on the handle substrate 100 by CVD, MOCVD or sputtering.

The second step: A photoresist/photomask with desired pattern is coated on the first material layer.

The third step: The first material layer is etched with suitable etchant or sources, thereby forming the first patterned structure 402. The shape of the first patterned structure 402 may be triangle, rectangular, trapezoid, or irregular shape.

The fourth step: The photoresist/photomask is removed.

The fifth step: A second material layer is formed on a surface of the first patterned structure 402 by CVD, MOCVD or sputtering.

The sixth step: The excess second material layer (over the first patterned structure 402) is removed to form the second patterned structure 404.

In the annealing described above, a temperature of the annealing is, for example, between 900° C. and 1200° C., and a time of the annealing is, for example, from 4 hours to 30 hours. In detail, the annealing may further include cleaning the to-be-bonded surfaces by RCA clean and polishing, bonding the to-be-bonded surfaces with pressure, and performing the annealing at above annealing conditions. If necessary, polishing and pre-double-polishing may be performed on the N type layer 200 or the high-resistance silicon substrate 104 before growing the III-V semiconductor layer 106. Moreover, before bonding, a rimming step may be performed on the handle substrate 100 (and other layers formed thereon).

To prove the performance of the present invention, experimental examples are provided below. However, those examples are not used to limit the scope of the invention.

Experimental Example

An epitaxial substrate as shown in FIG. 1 was manufactured. The handle substrate is P-type Si (111) with low resistance (3.5 mohm·cm) having a thickness of 1000 µm, and the handle substrate has a bevel of 32.8 degrees. The heat dissipation layer on the handle substrate is AlN with a thickness of 500 nm. The high-resistance silicon substrate on the heat dissipation layer is P-type Si (111) with high resistance (1500 ohm·cm) having a thickness of 5 µm. The buffer layer on the high-resistance silicon substrate is a AlN/AlGaN film with a thickness of 3 µm. The III-V semiconductor layer grown on the buffer layer is GaN with a thickness of 2 µm. The diameters of the III-V semiconductor layer, the buffer layer, and the high-resistance silicon substrate are smaller than the diameter of the handle substrate, and the difference therebetween is about 650-750 µm, thereby the epitaxial substrate being a convex substrate. Moreover, during bonding the heat dissipation layer to the high-resistance silicon substrate, the annealing was performed at 1100° C. for 4 hours.

Thereafter, the convex substrate of the experimental example was used to perform the epitaxial process, and then the slip lines at the edge of grown wafer were observed by optical microscope. The lengths of the slip lines at different wafers were obtained to be 1.84 mm (wafer 1) and 1.75 mm (wafer 2), respectively.

Comparative Example

A substrate was used to perform the epitaxial process, wherein the substrate is consisted of a P-type Si (111) with low resistance (3.5 mohm·cm) having a thickness of 1000 µm, a AlN/AlGaN buffer layer with a thickness of 3 µm, and a GaN layer with a thickness of 2 µm. In other words, the substrate of comparative example does not have the heat dissipation layer and the high-resistance silicon substrate in the experimental example, and the diameters of the low resistance substrate, the buffer layer and the GaN layer are the same.

Next, the slip lines at the edge of grown wafer were observed by optical microscope. The lengths of the slip lines at different wafers were obtained to be 2.35 mm (wafer 1) and 2.02 mm (wafer 2), respectively.

Data from the experimental example and the comparative example are combined into the following table 1.

TABLE 1

|  | Comparative example | Experimental example |
| --- | --- | --- |
| Length of slip line (wafer 1) | 2.35 mm | 1.84 mm |
| Length of slip line (wafer 2) | 2.02 mm | 1.75 mm |
| Average length of slip lines | 2.19 mm | 1.80 mm |

According to table 1, it is shown that length of the slip line generated during epitaxial process by using the convex substrate can be reduced by 17.8% compared with that of the substrate of the comparative example. Since the slip line is shortened, it can increase the usage area of the wafer so as to reduce the production cost.

Based on the above, according to the epitaxial substrate of the invention, the heat dissipation can be improved by the heat dissipation layer for reducing the thermal impact to the device and increasing the device lifetime, and thus the device can be adopted to higher power field. Moreover, the epitaxial substrate of the present invention is designed to be a convex substrate, so it can prevent the edge of the wafer from collision or crush, and thus defects can be eliminated. Furthermore, since the epitaxial substrate of the present invention has a combination of the high-resistance silicon substrate and the handle substrate, the capability of voltage resistance of the substrate and the mechanical strength can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An epitaxial substrate, comprising:
   a handle substrate;
   a heat dissipation layer on the handle substrate;
   a high-resistance silicon substrate on the heat dissipation layer, wherein the high-resistance silicon substrate has a resistance more than 100 ohm·cm; and
   a III-V semiconductor layer grown on the high-resistance silicon substrate, wherein diameters of the III-V semiconductor layer and the high-resistance silicon substrate are smaller than a diameter of the handle substrate, thereby the epitaxial substrate being a convex substrate, and the difference between the diameter of the handle substrate and the diameter of the high-resistance silicon substrate is between 600 μm and 1500 μm.

2. The epitaxial substrate according to claim 1, wherein the heat dissipation layer is consisted of a first patterned structure and a second patterned structure, a material of the first patterned structure is different from a material of the second patterned structure, and the first patterned structure and the second patterned structure are complementary structures.

3. The epitaxial substrate according to claim 1, wherein a thickness of the high-resistance silicon substrate is less than 5 μm.

4. The epitaxial substrate according to claim 1, wherein the III-V semiconductor layer comprises:
   a III-V semiconductor film; and
   a buffer layer disposed between the III-V semiconductor film and the high-resistance silicon substrate.

5. The epitaxial substrate according to claim 1, further comprising an N type layer disposed between the III-V semiconductor layer and the high-resistance silicon substrate.

6. The epitaxial substrate according to claim 1, wherein the heat dissipation layer comprises:
   a first heat dissipation film on the handle substrate;
   a barrier layer on the first heat dissipation film; and
   a second heat dissipation film on the barrier layer.

* * * * *